United States Patent [19]
Debaty

[11] Patent Number: 5,438,285
[45] Date of Patent: Aug. 1, 1995

[54] PHASE/FREQUENCY COMPARATOR

[75] Inventor: Pascal Debaty, Domene, France

[73] Assignee: SGS-Thomson Microelectronics S.A., Gentilly, France

[21] Appl. No.: 32,510

[22] Filed: Mar. 17, 1993

[30] Foreign Application Priority Data

Mar. 17, 1992 [FR] France ................. 92 03547

[51] Int. Cl.⁶ .................................................. H03K 5/26
[52] U.S. Cl. ........................................ 327/3; 327/5; 327/7; 327/12
[58] Field of Search ............... 328/133, 134; 307/514, 307/516, 470, 262; 327/2, 3, 7, 10, 12, 40, 41, 42, 43

[56] References Cited

U.S. PATENT DOCUMENTS

| | | | |
|---|---|---|---|
| 3,626,307 | 12/1971 | Koyama | 328/133 |
| 3,714,463 | 1/1973 | Laune | 328/134 |
| 4,090,143 | 5/1978 | Merrell | 328/134 |
| 4,281,259 | 7/1981 | Ozawa | 328/133 |
| 4,322,643 | 3/1982 | Preslar . | |
| 4,354,124 | 10/1983 | Shima et al. . | |
| 4,451,794 | 5/1984 | Yamada | 307/516 |
| 4,502,014 | 2/1985 | Bismarck | 307/470 |
| 4,594,563 | 6/1986 | Williams | 328/134 |
| 4,751,469 | 6/1988 | Nakagawa | 328/133 |
| 4,777,447 | 10/1988 | Mueller | 328/133 |
| 4,851,784 | 7/1989 | Wells et al. | 307/514 |
| 4,904,948 | 2/1990 | Asami | 328/133 |
| 4,928,026 | 5/1990 | Ebesyu | 328/133 |
| 5,059,833 | 10/1991 | Fujii | 328/133 |

OTHER PUBLICATIONS

IEEE Journal of Solid–State Circuits, No. 2, 1987, New York, US, pp. 255–261, Deog-Kyoon Jeong, et al., "Design of PLL-Based Clock Generation Circuits".

Primary Examiner—Timothy P. Callahan
Assistant Examiner—T. Lam
Attorney, Agent, or Firm—Greenfield & Sacks

[57] ABSTRACT

A phase/frequency comparator includes: two inputs which respectively receive first and second logic signals; a first logic gate which is at an active state during a duration equal to the phase advance of the first signal with respect to the second signal; and a second logic gate which is at an active state during a duration equal to the phase advance of said second signal with respect to the first signal. The phase/frequency comparator also includes: a first switching element operated by the active state of the second gate to prevent transmission to the first gate a state liable to switch the first gate to its active state; and a second switching element operated by the active state of the first gate to prevent transmission to the second gate a state liable to switch the second gate to its active state.

25 Claims, 2 Drawing Sheets

PHASE/FREQUENCY COMPARATOR

BACKGROUND OF THE INVENTION

1. Field of the Invention

The present invention relates to phase/frequency comparators used in phase locked loops (PLL's), and more particularly to two-input/two-output comparators, the first output providing a signal when the first input is in phase advance with respect to the second, and the second output providing a signal when the second input is in phase advance with respect to the first.

2. Discussion of the Related Art

FIG. 1 illustrates a phase/frequency comparator commonly used in charge-pump PLL's. Such a comparator and its use are described in U.S. Pat. No. 3,610,954 which is herein incorporated by reference.

Input signals $f_A$ and $f_B$, the phases and/or frequencies of which must be compared, are in the form of rectangular signals and are applied to input terminals 10 and 12, respectively. Each input terminal is connected to a first input of a respective NAND gate 14 and 15. The output of each NAND gate 14 and 15 is connected to a first input of a respective NAND gate 17 and 18. The outputs of NAND gates 17 and 18 are looped back on a second input of the respective gate 14 and 15. The outputs of gates 17 and 18 are also connected to output terminals A and B, respectively.

The output of each gate 14 and 15 is also connected to a respective input of an NAND gate 20 and to an input of a respective NAND gate 22 and 24. Each gate 22 and 24 forms with a respective NAND gate 26 and 28, a latch. In each latch, the output of one of the first gates is looped back onto the free input of the second gate, and the output of the second gate is looped back onto a free input of the first gate. The output of each gate 22, 24 is connected to a second input of the respective gate 17 and 18 and to another respective input of gate 20. The output of gate 20 is connected to a third input of gates 17 and 18 and to the remaining inputs of gates 26 and 28.

At rest, outputs A and B are at 1 and signals $f_A$ and $f_B$ are supposed to be 1. In this case, gates 14, 15, 26 and 28 are at 0 and gates 20, 22 and 24 are at 1. If, for example, signal $f_A$ goes to 0, gate 14 goes to 1. Then, the three inputs of gate 17 are to 1 and the output A of gate 17 goes to 0. While going to 0, output A locks the state of gate 14, that is, independently of the state of signal $f_A$, gate 14 remains to 1. The state of gate 17 (therefore of output A) can no longer be modified by signal $f_A$. Additionally, the change of state of gate 14 has not affected whatsoever the latch circuit 22–26, the output of gate 22 remaining at 1.

When signal $f_B$ goes to 0, gate 15 goes to 1. All the inputs of gate 20 are set to 1. Then, gate 20 goes to 0 which urges outputs A and B to 1. Thus, output A has gone to 0 between a falling edge of signal $f_A$ and the next falling edge of signal $f_B$. Theoretically, the state of output B does not vary during this interval.

On the other hand, the zero-crossing of gate 20 switches the states of storing circuits 22–26 and 24–28, which allows for constantly maintaining outputs A and B at state 1 and urging gate 20 to 1. This enables outputs A and B to maintain their state 1 independently of the instants when the rising edges of signals $f_A$ and $f_B$ occur subsequently to the falling edge of signal $f_A$. The latch circuit 22–26 is restored to its initial state as soon as signal $f_A$ and output A are at 1. Circuit 24–28 is restored to its initial state as soon as signal $f_B$ and output B are at 1.

FIG. 2 shows exemplary waveforms of signals $f_A$ and $f_B$ and the corresponding output signals at terminals A and B. Signals $f_A$ and $f_B$ are represented such that, until a time $t_4$, the frequency of signal $f_A$ is higher than the frequency of signal $f_B$, and lower than that of $f_B$ after time $t_4$.

At times $t_1$, $t_2$ and $t_3$, the falling edges of signal $f_A$ occur prior to the corresponding falling edges of signal $f_B$. Then, as described in relation with FIG. 1 and as represented, output A crosses zero between each falling edge of signal $f_A$ and the next falling edge of signal $f_B$.

At times $t_5$, $t_6$ and $t_7$, the falling edges of signal $f_B$ occur prior to the corresponding falling edges of signal $f_A$. Then, as represented, output B crosses zero between each falling edge of signal $f_B$ and the next falling edge of signal $f_A$.

The above explanations have been given assuming that the various gates instantaneously switch as soon as their input signals are switched. Of course, this is not exactly the case in practice, and each gate has a given switching time. As a result, parasitic pulses occur. Particularly, when a falling edge of signal $f_B$ appears at input 12 after a falling edge at input 10, this generates, as indicated, the sequential switching of gates 15, 20 and 17 and should not affect gate 181 However, since gate 15 is connected to gate 18, the latter temporarily has all its inputs to 1 before being inhibited by the switching of gate 20. This causes a short parasitic pulse at output B lasting approximately for the switching time of gate 20.

FIG. 2 also shows the above mentioned parasitic pulses. These parasitic pulses occur at output A at each falling edge of signal $f_A$ after time $t_4$ and occur at output B at each falling edge of signal $f_B$ before time $t_4$.

When outputs A and B respectively control current sources for charging and discharging a capacitor, the parasitic pulses are of such short durations that they have a negligible influence upon the charge of the capacitor and may therefore be tolerated. However, in some applications, for example if a digital circuit is controlled by outputs A and B, parasitic pulses are no longer tolerable.

SUMMARY OF THE INVENTION

An object of the present invention is to provide a phase/frequency comparator, of the type usable with a charge-pump PLL, free of parasitic pulses at its outputs, even of very short parasitic pulses conventionally occurring at one output when the other output is switched.

This object is achieved with a phase/frequency comparator including two inputs respectively receiving first and second logic signals; a first logic gate being at an active state during a duration equal to the phase advance of the first signal with respect to the second signal; and a second logic gate being at an active state during a duration equal to the phase advance of the second signal with respect to the first signal.

According to the invention, the phase/frequency comparator includes a first switching device controlled by the active state of the second gate to prevent transmission to the first gate a state liable to cause the first gate to switch to its active state, and a second switching device controlled by the active state of the first gate to prevent transmission to the second gate a state liable to cause the second gate to switch to its active state.

According to an embodiment of the invention, the first and second gates are NAND gates, and the first and second switching devices are AND gates, an input of the first AND gate being connected to the output of the second NAND gate, and an input of the second AND gate being connected to the output of the first NAND gate.

The foregoing and other objects, features, aspects and advantages of the invention will become apparent from the following detailed description of the present invention which should be read in conjunction with the accompanying drawings.

DETAILED DESCRIPTION

Figure 1:
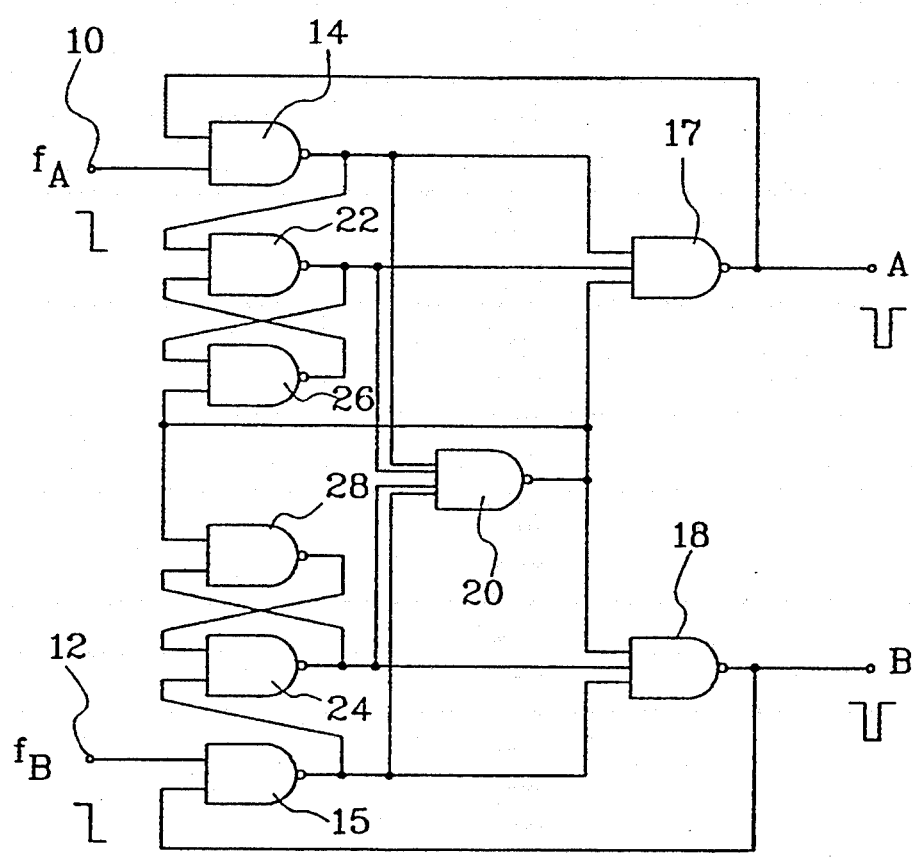
FIG. 1, above described, shows a conventional phase/frequency comparator for a charge-pump PLL.
Figure 2:
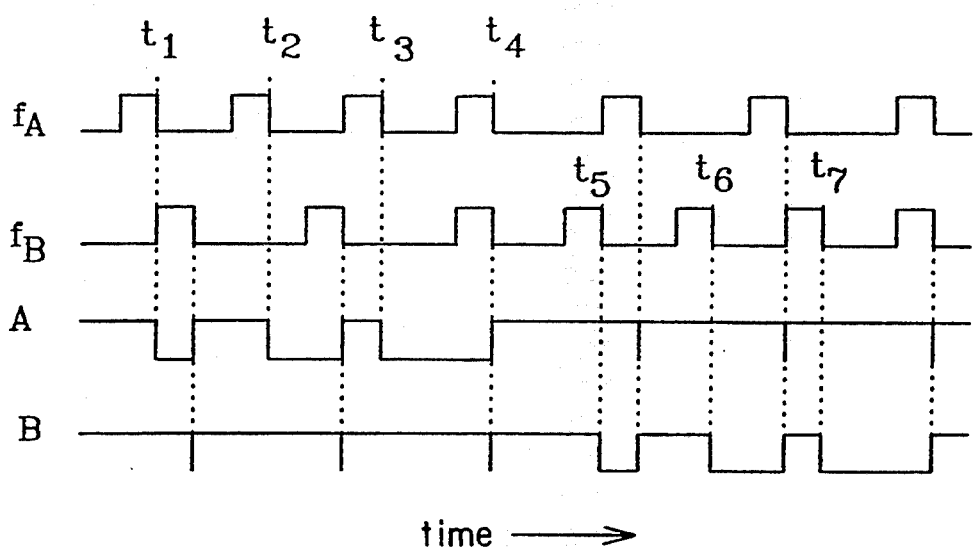
FIG. 2, above described, illustrates signal waveforms in relation to the circuit of FIG. 1.
Figure 3:
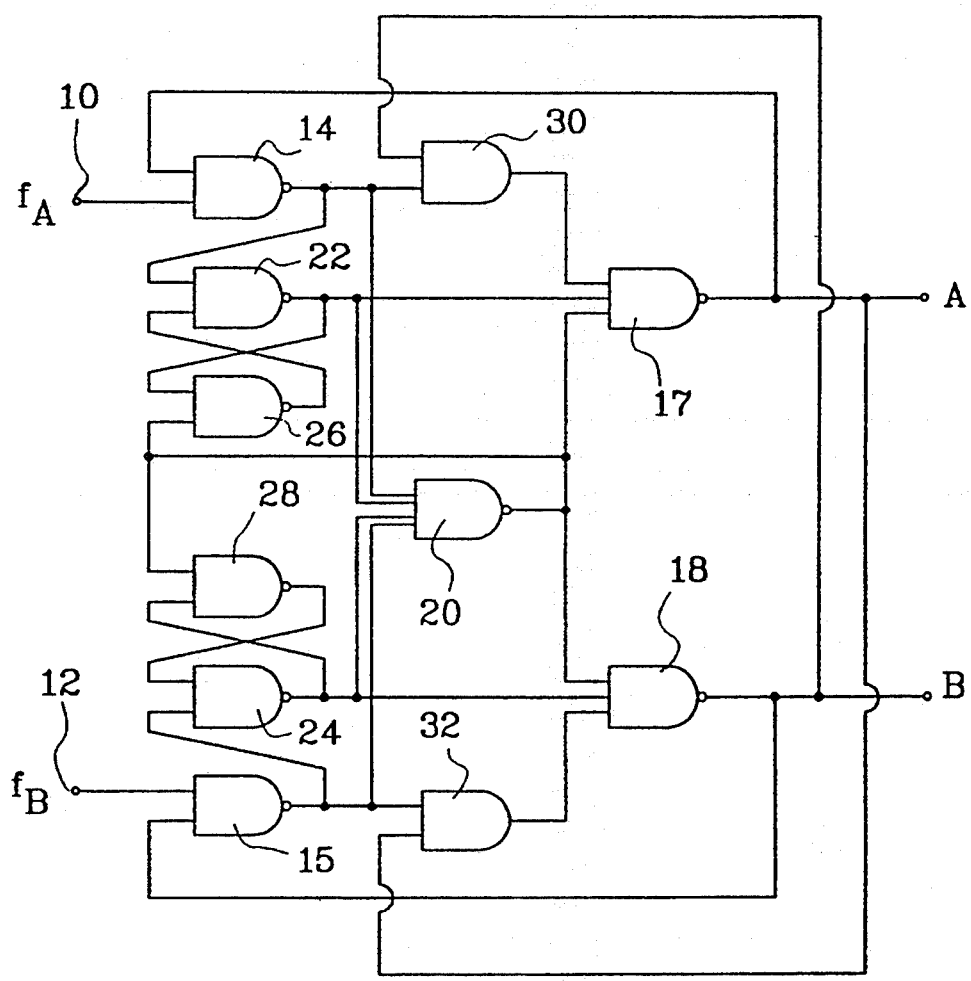
FIG. 3 shows an embodiment of a phase/frequency comparator according to the invention.

In FIG. 3, are some of the same elements as in FIG. 1, designated with the same references.

According to the invention, the outputs of gates 14 and 15 are not directly connected to gates 17 and 18. The outputs of gates 14 and 15 are respectively connected to an input of an AND gate 30 and to an input of an AND gate 32. The outputs of gates 30 and 32 are respectively connected to gates 17 and 18. A second input of gate 30 is connected to output B and a second input of gate 32 is connected to output A.

Assuming that output A has just gone to 0 because of the occurrence of a falling edge of signal $f_A$, gate 32 remains at 0 even when gate 15 goes to 1 during the next falling edge of signal $f_B$. Output B therefore remains at 1. State 1 of gate 15 is transmitted to gate 18 only when output A has gone to 1 after switching of gate 20. Thus, the parasitic pulses at output B are inhibited during the switching time of gate 20.

Assuming output B has just gone to 0 because of the occurrence of a falling edge of signal $f_B$, gate 30 remains at 0 even when gate 14 goes to 1 during the next falling edge of signal $f_A$. Output A therefore remains at 1. State 1 of gate 14 is transmitted to gate 17 only when output B has gone to 1 after switching of gate 20. Thus, the parasitic pulses at output A are inhibited during the switching time of gate 20.

The present invention has been described with respect to a preferred embodiment using specific types of logic gates operating in a negative logic mode. Those skilled in the art will be able to suitably select gates 30 and 32 according to the type of gates used in the phase/frequency comparator.

More generally, gates 30 and 32 can be considered as switches disposed between gates 14 and 17, on the one hand, and 15 and 18, on the other hand, these switches being switched on by the active state of outputs A or B (0 in the described example), thus preventing transmission to gates 17 and 18 of a state (1) liable to cause the switching of these gates.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. A phase/frequency comparator comprising:

first and second input terminals respectively receiving first and second logic signals;

a first logic gate, having at least first and second inputs, coupled to the first and second input terminals, providing an output being at an active state during a time duration substantially equal to a time during which the first logic signal precedes the second logic signal in phase;

a second logic gate, having at least first and second inputs, coupled to the first and second input terminals, providing an output being at an active state during a time duration substantially equal to a time during which the second logic signal precedes the first logic signal in phase;

a first latching circuit, having an input coupled to the first logic signal and providing an output coupled to the first input of the first logic gate;

a second latching circuit, having an input coupled to the second logic signal and providing an output coupled to the first input of the second logic gate;

first means for switching, receiving an input from the output of the second logic gate and providing an output to the second input of the first logic gate, controlled by the second logic gate such that during the active state of the second logic gate, the first switching means prevents transmission to the first logic gate of a signal which would cause the first logic gate to go to its active state; and second means for switching, receiving an input from the output of the first logic gate and providing an output to the second input of the second logic gate, controlled by the first logic gate such that during the active state of the first logic gate, the second switching means prevents transmission to the second logic gate of a signal which would cause the second logic gate to go to its active state.

2. A phase/frequency comparator as claimed in claim 1, wherein the first and second means for switching include first and second AND gates.

3. A phase/frequency comparator comprising:

first and second input terminals respectively receiving first and second logic signals;

a first logic gate, having at least first and second inputs, coupled to the first and second input terminals, providing an output being at an active state during a time duration substantially equal to a time during which the second logic signal in phase;

a second logic gate, having at least first and second inputs, coupled to the first and second input terminals, providing an output being at an active state during a time duration substantially equal to a time during which the second logic signal precedes the first logic signal in time;

a first latch, having an input coupled to the first logic signal and providing an output coupled to the first input of the first logic gate;

a second latch, having an input coupled to the second logic signal and providing an output coupled to the first input of the second logic gate;

a first switching element, receiving an input from the output of the second logic gate and providing an output to the second input of the first logic gate, controlled by the second logic gate such that during the active state of the second logic gate, the first switching element prevents transmission to the first logic gate of a signal which would cause the first logic gate to go to its active state; and a second switching element, receiving an input from the output of the first logic gate and providing an output to the second input of the second logic gate, controlled by the first logic gate such that during the active state of the first logic gate, the second switching element prevents transmission to the second logic gate of a signal which would cause the second logic gate to go to its active state.

4. A phase/frequency comparator as claimed in claim 3, wherein the first logic gate includes a first NAND gate and the second logic gate includes a second NAND gate, the first and second switching elements include first and second AND gates, an input of the first AND gate being coupled to an output of the second NAND gate, and an input of the second AND gate being coupled to an output of the first NAND gate.

5. A phase/frequency comparator comprising:
means for receiving first and second logic signals;
first means, coupled to the means for receiving and having at least first and second inputs, for producing an output having an active state signal during a time duration substantially equal to a phase advance of the first logic signal with respect to the second logic signal;
second means, coupled to the means for receiving and having at least first and second inputs, for producing an output having an active state signal during a time duration substantially equal to a phase advance of the second logic signal with respect to the first logic signal;
a first latching circuit, having an input coupled to the first logic signal and providing an output coupled to the first input of the first means;
a second latching circuit, having an input coupled to the second logic signal and providing an output coupled to the first input of the second means;
first means for switching, receiving an output from the second means for providing an output to the second input of the first means, controlled by the second means for producing such that when the second means is producing an active state signal, the first means for switching is prevented from transmitting to the first means, a signal which would cause the first means to produce an active state signal; and
second means for switching, receiving an input from the output of the first means for providing an output to the second input of the second means, controlled by the first means such that when the first means is producing an active state signal, the second means for switching is prevented from transmitting to the second means, a signal which would cause the second means to produce an active state signal.

6. A phase/frequency comparator as claimed in claim 5, wherein the first means includes a first NAND gate and the second means includes a second NAND gate, wherein the first and second means for switching include first and second AND gates, an input of the first AND gate being coupled to an output of the second NAND gate, and an input of the second AND gate being coupled to an output of the first NAND gate.

7. A method of performing phase/frequency comparison comprising the steps of:
A) receiving first and second logic signals;
B) providing, with a first gate, a first output signal having an active state when the first logic signal is in phase advance with respect to the second logic signal;
C) providing, with a second gate, a second output signal having an active state when the second logic signal is in phase advance with respect to the first logic signal; and
D) preventing a propogation of a parasitic pulse from the first gate to the first output signal in response to the second output signal being in the active state.

8. A method as claimed in claim 7, wherein the step C of providing a second output signal includes the step of using first and second NAND gates for providing the first and second output signals, respectively.

9. A method as claimed in claim 8 wherein the step D of preventing includes the step of using a first AND gate, coupled to the first and second NAND gates, and controlled by the second NAND gate.

10. A method as claimed in claim 9, further comprising the step of:
E) preventing a propogation of a parasitic pulse from the second gate to the second output signal when the first output signal is in the active state, wherein the step E of preventing includes the step of using a second AND gate, coupled to the first and second NAND gates, and controlled by the first NAND gate.

11. A phase/frequency comparator comprising:
first and second input terminals respectively receiving first and second logic signals;
first and second output terminals respectively providing first and second output signals;
first and second flip-flops, each flip-flop having a complementary input and providing an output;
first and second logic gates, each having a first input, the first input of each of the first and second logic gates being coupled respectively to the first and second input terminals, each having a second input, the second input of each of the first and second logic gates being coupled respectively to the first and second output terminals, and each having an output coupled to a respective input of the first and second flip-flops;
a third logic gate having first and second inputs coupled respectively to the outputs of the first and second logic gates, third and fourth inputs coupled respectively to the outputs of the first and second flip-flops, and an output coupled to an input of the first and second flip-flops;
fourth and fifth logic gates, each of the fourth and fifth logic gates having a first input coupled to a respective output of the first and second logic gates, and a second input coupled respectively to the second and first output terminals; and
sixth and seventh logic gates, each of the sixth and seventh logic gates having a first input coupled to a respective output of the fourth and fifth logic gates, a second input coupled to a respective output of the first and second flip-flops, a third input coupled to the output of the third gate, and an output coupled to a respective first or second output terminal.

12. A phase/frequency comparator as claimed in claim 11, wherein the first, second, third, sixth and seventh logic gates include NAND gates and the fourth and fifth logic gates include AND gates.

13. A phase/frequency comparator as claim in claim 11, wherein the first and second flip-flops include cross-coupled NAND gates.

14. The phase/frequency comparator of claim 1, further comprising:
 a third logic gate, receiving as input the first logic signal and the output of the first logic gate, and providing as output a signal coupled to one of the first and second inputs of the first logic gate and to an input of the first latching circuit; and
 a fourth logic gate, receiving as input the second logic signal and the output of the second logic gate, and providing as output a signal coupled to one of the first and second inputs of the second logic gate and to an input of the second latching circuit.

15. The phase/frequency comparator of claim 14, wherein the third and fourth logic gates are two-input NAND gates.

16. The phase/frequency comparator of claim 15, further comprising a fifth logic gate receiving as input the output of the third and fourth logic gates and the outputs of the first and second latching circuits, and providing as output a signal coupled to a third input of the first logic gate and a third input of the second logic gate.

17. The phase/frequency comparator of claim 16, wherein the output of the fifth logic gate further couples to an input of the first latching circuit and to an input of the second latching circuit.

18. The phase/frequency comparator of claim 14, further comprising a fifth logic gate receiving as input the output of the third and fourth logic gates and the outputs of the first and second latching circuits, and providing as output a signal coupled to a third input of the first logic gate and a third input of the second logic gate.

19. The phase/frequency comparator of claim 18, wherein the output of the fifth logic gate further couples to an input of the first latching circuit and an input of the second latching circuit.

20. The phase/frequency comparator of claim 3, further comprising:
 a third input gate, receiving as input the first input signal and the output of the first logic gate, and providing as output a signal coupled to one of the first and second inputs of the first logic gate and to an input of the first latch; and
 a fourth logic gate, receiving as logic the second input signal and the output of the second logic gate, and providing as output a signal coupled to one of the first and second inputs of the second logic gate and to an input of the second latch.

21. The phase/frequency comparator of claim 20, wherein the third and fourth logic gates are two-input NAND gates.

22. The phase/frequency comparator of claim 21 further comprising a fifth logic gate receiving as input the output of the third and fourth logic gates and the outputs of the first and second latches, and providing as output a signal coupled to a third input of the first logic gate and a third input of the second logic gate.

23. The phase/frequency comparator of claim 20, wherein the third and fourth logic gates are two-input NAND gates.

24. The phase/frequency comparator of claim 23, further comprising a fifth logic gate receiving as input the output of the third and fourth logic gates and the outputs of the first and second latches, and providing as output a signal coupled to a third input of the first logic gate and a third input of the second logic gate.

25. The phase/frequency comparator of claim 24, wherein the output of the fifth logic gate further couples to an input of the first latching circuit and an input of the second latching circuit.

* * * * *